(12) United States Patent
Park et al.

(10) Patent No.: US 10,195,661 B2
(45) Date of Patent: Feb. 5, 2019

(54) ELECTROMAGNETIC WAVE SHIELDING THIN FILM, ELECTRONIC DEVICE PROVIDED WITH ELECTROMAGNETIC WAVE SHIELDING THIN FILM AND SHIELDING STRUCTURE, AND METHOD FOR MANUFACTURING ELECTROMAGNETIC WAVE SHIELDING THIN FILM

(71) Applicant: SAMSUNG ELECTRONICS CO., LTD., Suwon-si, Gyeonggi-do (KR)

(72) Inventors: Jin-man Park, Seoul (KR); Keum-hwan Park, Seoul (KR); Eun-soo Park, Suwon-si (KR); Ju-ho Lee, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 297 days.

(21) Appl. No.: 15/095,713

(22) Filed: Apr. 11, 2016

(65) Prior Publication Data

US 2017/0034965 A1 Feb. 2, 2017

(30) Foreign Application Priority Data

Jul. 27, 2015 (KR) ........................ 10-2015-0105667

(51) Int. Cl.
*H05K 9/00* (2006.01)
*H01J 37/34* (2006.01)
(Continued)

(52) U.S. Cl.
CPC .......... *B22D 23/003* (2013.01); *C22C 45/001* (2013.01); *C22C 45/008* (2013.01);
(Continued)

(58) Field of Classification Search
CPC ............. H01J 37/3414; H01J 2237/081; H01J 2237/332; B22D 23/003; C22C 45/00; C22C 45/001; C22C 45/04; C22C 45/008; C22C 45/08; C22C 45/02; C22C 45/10; C23C 14/14; C23C 14/34; C23C 14/205; C23C 14/3414; C23C 30/00; B29C 43/18; B29K 2079/08; B29K 2705/00; B29K 2995/0011; H05K 9/0024; H05K 9/0043; H05K 9/0084; Y10T 428/12556;
(Continued)

(56) References Cited

U.S. PATENT DOCUMENTS 7,626,832 B2 12/2009 Muramatsu et al.
8,248,822 B2 8/2012 Lu et al.
(Continued)

FOREIGN PATENT DOCUMENTS

JP 10-189321 7/1998
JP 2002-65869 3/2002
(Continued)

*Primary Examiner* — Michael E. La Villa
(74) *Attorney, Agent, or Firm* — Staas & Halsey LLP

(57) ABSTRACT

An electromagnetic wave shielding thin film for shielding from electromagnetic waves generated in an electronic part is provided. The electromagnetic wave shielding thin film includes metal plate which has elastic limit of 1% or more, strength of 1000 MPa or more, and a volume fraction of an amorphous phase of 50% or more.

15 Claims, 9 Drawing Sheets

(51) Int. Cl.
| | |
|---|---|
| B22D 23/00 | (2006.01) |
| C23C 14/34 | (2006.01) |
| C22C 45/08 | (2006.01) |
| C22C 45/02 | (2006.01) |
| C23C 14/14 | (2006.01) |
| C22C 45/04 | (2006.01) |
| C23C 30/00 | (2006.01) |
| C22C 45/10 | (2006.01) |
| C22C 45/00 | (2006.01) |
| C23C 14/20 | (2006.01) |
| B29C 43/18 | (2006.01) |
| B29K 79/00 | (2006.01) |
| B29K 705/00 | (2006.01) |

(52) U.S. Cl.
CPC .............. *C22C 45/02* (2013.01); *C22C 45/04* (2013.01); *C22C 45/08* (2013.01); *C22C 45/10* (2013.01); *C23C 14/14* (2013.01); *C23C 14/205* (2013.01); *C23C 14/34* (2013.01); *C23C 14/3414* (2013.01); *C23C 30/00* (2013.01); *H01J 37/3414* (2013.01); *H05K 9/0024* (2013.01); *H05K 9/0043* (2013.01); *H05K 9/0084* (2013.01); *B29C 43/18* (2013.01); *B29K 2079/08* (2013.01); *B29K 2705/00* (2013.01); *B29K 2995/0011* (2013.01); *C22C 45/00* (2013.01); *H01J 2237/081* (2013.01); *H01J 2237/332* (2013.01); *Y10T 428/12556* (2015.01); *Y10T 428/12569* (2015.01); *Y10T 428/12806* (2015.01); *Y10T 428/12812* (2015.01); *Y10T 428/12951* (2015.01); *Y10T 428/2495* (2015.01); *Y10T 428/24967* (2015.01); *Y10T 428/265* (2015.01)

(58) Field of Classification Search
CPC ..... Y10T 428/12569; Y10T 428/12806; Y10T 428/12812; Y10T 428/12951; Y10T 428/2495; Y10T 428/24967; Y10T 428/265

See application file for complete search history.

(56) References Cited

U.S. PATENT DOCUMENTS

| | | |
|---|---|---|
| 8,629,355 B2 | 1/2014 | Kwon et al. |
| 2008/0268207 A1* | 10/2008 | Ishigaki ............... B32B 7/02 428/172 |
| 2010/0079972 A1 | 4/2010 | Chen et al. |
| 2014/0218851 A1 | 8/2014 | Klein et al. |

FOREIGN PATENT DOCUMENTS

| | | |
|---|---|---|
| JP | 2014-17421 | 1/2014 |
| KR | 10-2006-0003804 | 1/2006 |
| KR | 10-0648162 | 11/2006 |
| KR | 10-2013-0000743 | 1/2013 |
| KR | 10-1217708 | 1/2013 |
| KR | 10-1411021 | 6/2014 |
| KR | 10-1411980 | 6/2014 |
| KR | 10-1424723 | 8/2014 |
| KR | 10-1425179 | 8/2014 |
| KR | 10-2014-0120672 | 10/2014 |
| KR | 10-1452729 | 10/2014 |
| KR | 10-2014-0147263 | 12/2014 |
| KR | 10-1472667 | 12/2014 |
| KR | 10-1487227 | 1/2015 |
| KR | 10-2015-0012795 | 2/2015 |
| KR | 10-2015-0116233 | 10/2015 |

\* cited by examiner

ELECTROMAGNETIC WAVE SHIELDING THIN FILM, ELECTRONIC DEVICE PROVIDED WITH ELECTROMAGNETIC WAVE SHIELDING THIN FILM AND SHIELDING STRUCTURE, AND METHOD FOR MANUFACTURING ELECTROMAGNETIC WAVE SHIELDING THIN FILM

CROSS-REFERENCE TO RELATED APPLICATIONS

This application claims benefit of foreign priority from Korean Patent Application No. 10-2015-0105667, filed on Jul. 27, 2015, in the Korean Intellectual Property Office, the disclosure of which is incorporated herein by reference in its entirety.

BACKGROUND

1. Field

Apparatus and methods consistent with the present disclosure relate to an electromagnetic wave shielding thin film and a method for forming the same, and more particularly, to an electromagnetic wave shielding thin film having superelasticity and a method for forming the same.

2. Description of the Related Art

The electromagnetic wave shielding technology is normally applied from the two aspects. The first aspect is to prevent electromagnetic waves generated in devices from influencing users. As electronic and communication devices are increasingly used in recent years, there is growing concern and interest in harmful effect of electromagnetic waves, and, as the results of researches on negative influence of the electromagnetic waves on the human being are continuously announced, various electromagnetic wave shielding methods for protecting users' health are developing. The second aspect is to protect devices from electromagnetic waves. Normal electronic devices are provided with main boards having a plurality of chips mounted on a printed circuit board. The electronic circuit of the main board is susceptible to Electro Magnetic Interference (EMI) or Radio Frequency Interference (RFI). Therefore, a shielding structure for blocking interference and protecting circuit parts is utilized, and various structures having an electromagnetic wave shielding function are provided on chips to block interference by emitting electromagnetic waves or radio frequency, and thus prevent malfunction of devices or damages to parts, which may be caused by such interference. The basic principle of the electromagnetic wave shielding is reflecting or absorbing low-impedance magnetic-field waves which are guided waves generated in parts to which voltage is applied through electromagnetic wave shielding material, and the corresponding electromagnetic wave shielding material should have electrical conductivity.

The related-art electromagnetic wave shielding structure is divided into two types of structures in view of materials. The most widely used structure is a shield can which is made of metal. The shield can is mounted to enclose the whole parts and block electromagnetic wave interference between parts or between an interior and an exterior of a device. The shield can is normally made of SUS to reflect electromagnetic waves on a surface, and has a high dielectric constant and thus can block an electromagnetic field very efficiently. The shield can is implemented by using crystalline alloy material such as stainless steel, thereby showing electromagnetic wave shielding performance. As the electronic devices have become thinner and slimmer, there has been an attempt to reduce the thickness and size of the shield can. However, since the elastic limit of the material is about 0.02%, plastic deformation may occur in the shield can due to the use of the shield can when it is manufactured as a thin or slim structure, and the quality of a product may deteriorate and the lifespan of the product may be reduced. Furthermore, when the present material is applied to a flexible electronic device, the shield can may suffer from plastic deformation in a deformation range of the device. In addition, insufficient elasticity of the material may cause a defect when an electronic device is manufactured and assembled. That is, in a mass production process in which the shield can with the same shape is repeatedly produced by a pressing method, deformation passing the elastic limit of material easily occurs, and the shield can may be in contact with inner elements, and thus may cause devices to be out of order and may not block electromagnetic waves.

Another type of electromagnetic wave shielding material is high elasticity composite material in which a polymer matrix is charged with conductive material such as metal powder, carbon nanotube, and graphene. Such high elasticity composite material can live up to the demand for miniaturization and slimness of electronic devices, and has both flexibility and an electromagnetic wave shielding property to be applied to flexible electronic devices. When the high elasticity composite material is combined with material such as polymer to have flexibility, there are problems that the flexibility is low in comparison to pure metal material and a manufacturing process is also complicated in comparison to a forming or processing process of existing metal material. In addition, there is a demand for improvement in distribution technology for distributing conductive material uniformly to show a shielding characteristic.

SUMMARY

Exemplary embodiments of the present disclosure overcome the above disadvantages and other disadvantages not described above. Also, the present disclosure is not required to overcome the disadvantages described above, and an exemplary embodiment of the present disclosure may not overcome any of the problems described above.

The present disclosure provides an electromagnetic wave shielding thin film which is made of an alloy having superelasticity and high strength.

According to an aspect of the present disclosure, there is provided an electromagnetic wave shielding thin film for shielding from electromagnetic waves generated in an electronic part, including metal plate which has elastic limit of 1% or more, strength of 1000 MPa or more, and a volume fraction of an amorphous phase of 50% or more.

The metal plate may include at least one metallic element selected from Ni, Hf, Cu, Zr, Co, Fe, Al, and Ti.

Thickness of the metal plate may be 30 nm-140 nm inclusive.

The electromagnetic wave shielding thin film may further include an insulation film which is disposed on one surface of the metal plate.

The insulation film may be a polyimide film.

The insulation film may be attached to the metal plate by separate hot press forming.

The metal plate may be formed on the insulation film by sputtering a crystalline alloy target.

The crystalline alloy target may have a crystal grain of 10 nm-5 μm inclusive.

The metal plate may be formed by melt-spinning a melted alloy having glass forming ability.

The alloy having the glass forming ability may include at least one compound selected from $Zr_{65}Al_{11}Cu_{24}$, $Zr_{62}Cu_{23}Fe_5Al_{11}$ and $Fe_{76}B_{18}Si_6$.

According to another aspect of the present disclosure, there is provided an electromagnetic wave shielding structure for shielding from electromagnetic waves generated in an electronic part, the electromagnetic wave shielding structure being provided to enclose the electronic part by forming metal plate in a predetermined shape, wherein the metal plate has elastic limit of 1% or more, strength of 1000 MPa or more, and a volume fraction of an amorphous phase of 50% or more.

The electromagnetic wave shielding structure may further include an insulation film disposed on one surface of the metal plate.

According to another aspect of the present disclosure, there is provided an electronic device including: an electronic part; and an electromagnetic wave shielding thin film for shielding the electronic part from electromagnetic waves, wherein the electromagnetic wave shielding thin film includes metal plate which has elastic limit of 1% or more, strength of 1000 MPa or more, and a volume fraction of an amorphous phase of 50% or more.

According to another aspect of the present disclosure, there is provided a method for forming a shielding thin film for shielding from electromagnetic waves generated in an electronic part, including: melting an alloy having glass forming ability; and forming metal plate by melt-spinning the melted alloy, such that the metal plate has elastic limit of 1% or more, strength of 1000 MPa or more, and a volume fraction of an amorphous phase of 50% or more.

The alloy having the glass forming ability may include at least one compound selected from $Zr_{65}Al_{11}Cu_{24}$, $Zr_{62}Cu_{23}Fe_5Al_{11}$ and $Fe_{76}B_{18}Si_6$.

The method may further include attaching an insulation film to the metal plate through separate hot pressing forming after forming the metal plate.

The insulation film may be polyimide film.

Additional and/or other aspects and advantages of the invention will be set forth in part in the description which follows and, in part, will be obvious from the description, or may be learned by practice of the invention.

BRIEF DESCRIPTION OF THE DRAWINGS

The above and/or other aspects of the present disclosure will be more apparent by describing certain exemplary embodiments of the present disclosure with reference to the accompanying drawings, in which.

DETAILED DESCRIPTION

Figure 1:
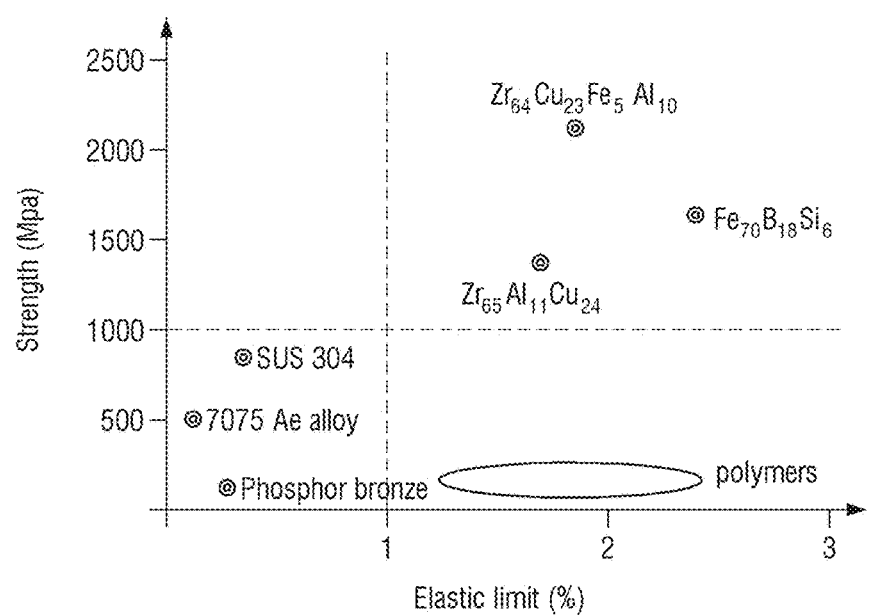
FIG. 1 is a graph showing comparison of elastic limit and strength of material for forming an electromagnetic wave shielding thin film according to an exemplary embodiment, and elastic limit and strength of normal material.

Reference will now be made in detail to the embodiments, examples of which are illustrated in the accompanying drawings, wherein like reference numerals refer to the like elements throughout. The embodiments are described below to explain the present invention by referring to the figures.

Exemplary embodiments of the present disclosure will be described herein below with reference to the accompanying drawings. The exemplary embodiments may, however, be embodied in many different forms and should not be construed as limited to the exemplary embodiments set forth herein. In the following description, well-known functions or constructions are not described in detail since they would obscure the invention in unnecessary detail. In addition, the drawings attached hereto may not be drawn according to a real scale and may be drawn to exaggerate dimensions of some elements for the sake of easy understanding of the present disclosure. All ranges recited in this disclosure and its claims, including ranges for certain dimensions, refer to inclusive ranges.

An electromagnetic wave shielding thin film disclosed in the present specification and claims has superelasticity and high strength, and specifically, refers to a thin film which has elastic limit of 1% or more and strength of 1000 MPa or more, and includes metal plate including an amorphous phase. The metal plate may include at least one metallic element selected from Ni, Hf, Cu, Zr, Co, Fe, Al, and Ti. The electromagnetic wave shielding thin film is disposed to enclose electronic parts arranged in an electronic device, and thus can block electromagnetic waves generated in the electronic parts within a range of a predetermined level. In this case, the electromagnetic wave shielding performance may depend on the thickness of the electromagnetic wave shielding thin film.

An amorphous alloy disclosed in the present specification and claims is a solid which has a crystal grain of 1 nm or less and does not have lattice periodicity which is a characteristic of crystals. In addition, the amorphous alloy does not have long-range order which is a characteristic of the crystalline alloy, but may have some short-range order on the atomic length scale due to the chemical bonding. Herein, the terms "order" and "disorder" are used as a concept indicating the presence or absence of any symmetry or correlation in the many particle systems, and the terms "long-range order" and "short-range order" are used as a concept distinguishing order in materials based on the length scale. The amorphous alloy and the crystalline alloy may be distinguished from each other according to the lattice periodicity which is determined by structure characterization technology such as X-ray diffraction and transmission electron microscopy.

The electromagnetic wave shielding thin film according to an exemplary embodiment may be formed by melt spinning or sputtering.

When the electromagnetic wave shielding thin film is formed by a deposition process through sputtering, a crystalline alloy target may be used. The crystalline alloy target may be an alloy which consists of three or more elements having glass forming ability. The glass forming ability means a relative criterion indicating a cooling rate for easily making an alloy of a specific composition into an amorphous alloy. In order to form an amorphous alloy by casting, a cooling rate higher than a predetermined level is required. When a casting method having a relatively slow solidification rate (for example, a copper mold casting method) is used, a compositional range for forming amorphous material is reduced. However, a rapid solidification method for solidifying using a ribbon or a wire by dropping a melting alloy down to a rotating copper roll, such as melt spinning, can obtain a maximized cooling rate of $10^4$-$10^6$ K/sec or higher, and thus can extend the compositional range for forming amorphous material. Therefore, the evaluation on how much glass forming ability a specific composition has may have the feature of indicating a relative value according to a cooling rate of a normal rapid cooling process. The glass forming ability depends on an alloy composition and a cooling rate. Since the cooling rate is in inverse proportion to cast thickness [(cooling rate)$\propto$(cast thickness)$^{-2}$], the glass forming ability can be relatively quantized by evaluating threshold thickness of casting material from which amorphous material can be obtained when being casted. For example, when the copper mold casting method is used, the glass forming ability may be expressed by threshold cast thickness (diameter in the case of a bar shape) of casting material from which an amorphous structure can be obtained. In another example, when a ribbon is formed by melt spinning, the glass forming ability may be expressed by threshold thickness of the ribbon from which amorphous material is formed. Accordingly, the alloy having the glass forming ability in the present specification and claims refers to an alloy from which an amorphous ribbon with cast thickness ranging from 20 to 100 μm (diameter of 5 mm or more in the case of a bar shape) can be obtained when molten metal of the alloy is casted at a cooling rate ranging from $10^4$ to $10^6$ K/sec.

According to an exemplary embodiment, the crystalline alloy target may be a Zr-based target. The alloy may be a ternary alloy consisting of Zr, Al, and Cu (Zr—Al—Cu alloy) or a ternary alloy consisting of Zr, Al, and Ni (Zr—Al—Ni alloy). Alternatively, the alloy may be a quaternary alloy consisting of Zr, Al, Cu, and Ni (Zr—Al—Cu—Ni alloy). Hereinafter, the above-described ternary alloy and quaternary alloy will be referred to as a Zr—Al—X alloy (herein, X is one or more elements selected from Cu and Ni). In this case, when the sum of Zr, Al, and X is 100 atomic percent (%), the alloy may have a compositional range in which Al has 5-20 atomic %, X (the sum of one or more elements selected from Cu and Ni) has 15-40 atomic %, and Zr has a remaining part. In another example, the alloy may further include one or more elements selected from Cr, Mo, Si, Nb, Co, Sn, In, Bi, Zn, V, Hf, Ag, Ti, and Fe in addition to the above-described Zr—Al—X alloy, and this may be referred to as Zr—Al—X—Y alloy (herein, Y is one or more elements selected from Cr, Mo, Si, Nb, Co, Sn, In, Bi, Zn, V, Hf, Ag, Ti, and Fe). When the sum of Zr, Al, X, and Y is 100 atomic %, Al may have 5-20 atomic %, X (that is, the sum of Cu and Ni) may have 15-40 atomic %, Y (the sum of one or more elements selected from Cr, Mo, Si, Nb, Co, Sn, In, Bi, Zn, V, Hf, Ag, Ti, and Fe) may have 8 atomic % or less (exceeding 0), and Zr may have a remaining part. For example, the crystalline alloy target may consist of $Zr_{65}Al_{11}Cu_{24}$, $Zr_{65}Al_{10}N_{10}Cu_{15}$ or $Zr_{62}Cu_{23}Fe_5Al_{10}$. However, this should not be considered as limiting, and the crystalline alloy target may include a single compound selected from the group consisting of $Zr_{41.2}Ti_{13.8}Cu_{12.5}Ni_{10}Be_{22.5}$, $Zr_{44}Ti_{11}Cu_{10}Ni_{10}Be_{25}$, $Zr_{35}Ti_{30}Cu_{8.25}Be_{26.75}$, $Fe_{76}B_{18}Si_6$, $Fe_{61}Mn_{10}Cr_4Mo_{14}Er_1C_{15}B_6$, $Fe_{63}Cr_4Nb_7B_{26}$, $Al_{85}Ni_5Co_2Y_8$, $Ce_{60}Al_{20}Ni_{10}Cu_{10}$, $Cu_{60}Zr_{20}Hf_{20}Ti_{10}$, $Pt_{57.5}Cu_{14.7}Ni_{5.3}P_{22.5}$, $Mg_{65}Cu_{25}Y_{10}$, $Au_{49}Ag_{5.5}Pd_{2.3}Cu_{26.9}Si_{16.3}$, $Pd_{43}Ni_{10}Cu_{27}P_{20}$ and $Ti_{40}Zr_{26}Be_{28}Fe_6$.

The crystalline alloy target used for manufacturing the electromagnetic wave shielding thin film may be implemented by appropriately heating an amorphous alloy or a nanocrystalline alloy which consists of three or more metallic elements having the above-described glass forming ability. Herein, the amorphous alloy does not have a substantially specific crystal structure. In the amorphous alloy, an X-ray diffraction pattern does not show a sharp peak at a specific Bragg angle, and a broad peak is observed in a wide angle range. In the heating process, the amorphous alloy may be made into a crystalline alloy while crystallization and grain growth continuously occur. In the case of the nanocrystalline alloy, the crystalline alloy may be made through grain growth in the heating process. In this case, the amorphous alloy or the nanocrystalline alloy may be heated at temperature which is greater than or equal to crystallization onset temperature of the amorphous alloy or nanocrystalline alloy and less than melting temperature.

The crystallization onset temperature recited in the present specification and claims is temperature at which the alloy in the amorphous state begins to be crystallized, and has a unique value according to a specific alloy composition. Therefore, the crystallization onset temperature of the nanocrystalline alloy may be defined as temperature at which the amorphous alloy having the same composition as that of the nanocrystalline alloy beings to be crystallized. The crystalline alloy target has excellent thermal stability in comparison to the amorphous alloy of the same composition. That is, the amorphous alloy may be locally crystallized by thermal energy transmitted from the outside due to its thermal instability, such that a nanocrystalline structure is locally formed. Such local crystallization is vulnerable to a structural relaxation phenomenon of the amorphous alloy, and fracture toughness is reduced. Therefore, there is a problem that the target is fractured during sputtering.

However, the crystalline alloy used as the target in the present disclosure has its own crystal grain size controlled through crystallization or grain growth from the amorphous alloy or nanocrystalline alloy. This alloy does not show a great microstructural change even when external heat is applied to the alloy, and thus does not show fracture which may be caused by thermal or mechanical instability of the related-art amorphous alloy or nanocrystalline alloy. In the case of a sputtering target, ions accelerated from plasma continuously collide during a process and accordingly the temperature of the sputtering target necessarily increases during the process. When the sputtering target is an amorphous alloy, local crystallization may proceed on the surface of the target due to increasing temperature during the sputtering process. Such local crystallization increases brittleness of the target and thus results in the target being easily fractured during the sputtering process. On the other hand, the crystalline alloy used as the target in the present disclosure has a microstructure in which crystal grains having a specific size range controlled by heat treatment are uniformly distributed, and thus has improved thermal/mechanical stability and does not show a local structural change even when the temperature of the target increases during the sputtering, and also does not show mechanical instability described above. Therefore, the crystalline alloy target of the present disclosure may be used for stably forming an amorphous and nano nitride composite thin film using sputtering.

Hereinafter, a method for manufacturing an alloy target for sputtering using a crystalline alloy will be explained by way of an example.

The alloy for sputtering which consists of the crystalline alloy of the present disclosure may be formed by casting the above-described amorphous alloy or nanocrystalline alloy in size and shape similar to those of an actually used sputtering target. The crystalline alloy target may be manufactured through crystallization or grain growth by heating the amorphous alloy or nanocrystalline alloy cast in the above-described way, that is, by annealing.

In another method, the target for sputtering may be manufactured by preparing a plurality of amorphous alloys or nanocrystalline alloys and combining the plurality of amorphous alloys or nanocrystalline alloys with one another by heat-pressing. Plastic deformation may occur in the amorphous alloys or nanocrystalline alloys during the heat-pressing. In this case, the annealing or the heat-pressing may be performed at temperature higher than or equal to the crystallization onset temperature of the amorphous alloy or nanocrystalline alloy and less than melting temperature. The crystallization onset temperature is defined as temperature at which an alloy having a specific composition is phase-shifted from the amorphous state to the crystalline state.

For example, the plurality of amorphous alloys or nanocrystalline alloys prepared as described above may be manufactured as amorphous alloy powder or nanocrystalline alloy powder. The target for sputtering may be manufactured in shape and size similar to those of a real target by pressure-sintering the aggregates of the alloy powder in a sintering mold and combining the aggregates. In this, the pressure-sintering may be performed at temperature higher than or equal to the crystallization onset temperature of amorphous material in the composition owned by the alloy powder and less than melting temperature. The aggregates of the amorphous alloy powder or the aggregates of the nanocrystalline alloy powder are combined with one another due to diffusion during a heating process, such that crystallization and/or grain growth occurs. In this case, time and/or temperature is controlled during the crystallization or grain growth process such that the size of the crystal grain has a specific range. Finally, the alloy which has undergone through the crystallization or grain growth has a crystal grain ranging from 10 nm to 5 μm, for example, 0.1-5 μm. Specifically, the alloy has a crystal grain ranging 0.1-1 μm, and more specifically, 0.1-0.5 μm, and much more specifically, 0.3-0.5 μm. In this case, the amorphous alloy powder or nanocrystalline alloy powder may be manufactured by automizing. Specifically, the alloy powder is formed by preparing molten metal in which the above-described elements having the glass forming ability are melted and cooling the molten metal by spraying inert gas such as argon gas onto the sprayed molten metal.

In another example, the plurality of amorphous alloys or nanocrystalline alloys prepared as described above may be amorphous alloy ribbons or nanocrystalline alloy ribbons. The target may be formed by forming multiple layers with these ribbons and then heat-pressing at temperature higher than or equal to the crystallization onset temperature in the composition owned by the alloy ribbons and less than melting temperature. In this case, the amorphous alloy ribbon layers or nanocrystalline alloy ribbon layers are combined with one another due to mutual diffusion between the ribbons during the pressing process, such that crystallization and/or grain growth occurs. An interface between the alloy ribbons layered in this process may dissipate due to mutual diffusion. In this case, the amorphous alloy ribbon or nanocrystalline alloy ribbon may be manufactured by a rapid solidification process such as melt spinning. Specifically, the amorphous alloy or nanocrystalline alloy of the ribbon shape may be manufactured by preparing molten metal in which the above-described elements having the glass forming ability are melted, pouring the molten metal onto the surface of a roll rotating at high speed, and rapidly solidifying the molten metal.

In another example, the plurality of amorphous alloys or nanocrystalline alloys prepared as described above may be amorphous alloy casting material or nanocrystalline alloy casting material. In this case, the amorphous alloy casting material or nanocrystalline alloy casting material may have a bar shape or a plate shape. In this case, layers of the plurality of amorphous alloy casting materials or layers of the plurality of nanocrystalline alloy casting materials are combined with one another due to mutual diffusion between individual alloy casting materials during the heat-pressing process, such that crystallization and/or grain growth occurs. In this case, an interface between the alloy casting materials may dissipate due to mutual diffusion. In this case, the amorphous alloy casting material or nanocrystalline alloy casting material may be manufactured using a suction method or a pressing method which injects the molten metal in a mold made of copper having high cooling capacity using pressure difference between the inside and the outside of the mold. For example, when a copper mold casting method is used, the amorphous alloy casting material or nanocrystalline alloy casting material of a predetermined shape may be manufactured by preparing molten metal in which the above-described elements having the glass forming ability are melted, pressing or sucking the molten metal and injecting the molten metal into a copper mold through a nozzle, and rapidly solidifying the molten metal. In the case of the alloy ribbon or alloy casting material, the size of the crystal grain of the alloy finally crystallized is adjusted within the above-described range like in the case of the alloy powder.

When the electromagnetic wave shielding thin film is formed by melt spinning, the thin film may be manufactured by melting the alloy forming the above-described crystalline alloy target. For example, the crystalline alloy target may be at least one compound selected from the group consisting of $Zr_{65}Al_{11}Cu_{24}$, $Zr_{65}Al_{10}Ni_{10}Cu_{15}$, $Zr_{62}Cu_{23}Fe_5Al_{10}$, $Zr_{41.2}Ti_{13.8}Cu1_{2.5}Ni_{10}Be_{22.5}$, $Zr_{44}Ti_{11}Cu_{10}Ni_{10}Be_{25}$, $Zr_{35}Ti_{30}Cu_{8.25}Be_{26.75}$, $Fe_{76}B_{18}Si_6$, $Fe_{61}Mn_{10}Cr_4Mo_{14}Er_1C_{15}B_6$, $Fe_{63}Cr_4Nb_7B_{26}$, $Al_{85}Ni_5Co_2Y_8$, $Ce_{60}Al_{20}Ni_{10}Cu_{10}$, $Cu_{60}Zr_{20}Hf_{20}Ti_{10}$, $Pt_{57.5}Cu_{14.7}Ni_{5.3}P_{22.5}$, $Mg_{65}Cu_{25}Y_{10}$, $Au_{49}Ag_{55}Pd_{2.3}Cu_{26.9}Si_{16.3}$, $Pd_{43}Ni_{10}Cu_{27}P_{20}$ and $Ti_{40}Zr_{26}Be_{28}Fe_6$. The thin film may be manufactured by heating and melting the crystalline alloy target at high temperature and then spraying the molten metal onto the surface of a rotating disk by inert gas pressure.

The electromagnetic wave shielding thin film according to exemplary embodiments may refer to a thin film which has a structure in which a nitride phase of metal and one or more metal phases are mixed with each other. The nitride phase of the metal may include Zr and Al as elements of nitride, and the metal phase may include one or more elements selected from Cu and Ni. In this case, the electromagnetic wave shielding thin film indicates a crystal structure of Zr nitride, and other metal elements including Al may be solidified in the Zr nitride in the form of nitride. In this case, the Zr nitride includes ZrN. For example, Al may be solidified in ZrN by being substituted for some positions of Zr forming the crystal lattice of ZrN. In this case, the nitride including Zr and Al may refer to a solid solution of ZrN and AlN. ZrN which is the nitride phase of the metal in the electromagnetic wave shielding thin film may have a nanocrystalline structure consisting of nano crystal grains. The metal phase may include a metal element having lower nitride forming capacity than that of a metal element forming nitride. The nitride phase of the metal in the electromagnetic wave shielding thin film has the nanocrystalline structure consisting of the nano crystal grains, whereas a small amount of metal phase may be distributed in the nano crystal grain. For example, the metal phase may be distributed in the unit of several atoms and may exist not to form a special crystal structure. However, the metal phase is not concentrated on a specific area and is uniformly distributed over the entire thin film.

FIG. 1 is a graph showing comparison of elastic limit and strength of material forming an electromagnetic wave shielding thin film according to an exemplary embodiment, and elastic limit and strength of normal material.

Referring to FIG. 1, the material forming the electromagnetic wave shielding thin film according to an exemplary embodiment dots within a range in which the elastic limit is greater than or equal to 1% and the strength is greater than or equal to 1000 MPa. Although the electromagnetic wave shielding thin film may be manufactured with material dotted out of the range in which the elastic limit is greater than or equal to 1.0% and the strength is greater than or equal to 1000 MPa, the thin film is inefficient. As flexible electronic devices are coming into the market in recent years, an electromagnetic wave shielding thin film which can return to its original state without plastic deformation after having been bent by more than a predetermined level is required, and a radius of curvature of the bent flexible electronic device gradually decreases with the enhancement of technology. Accordingly, there is a need for high elastic limit regarding materials used for the electromagnetic wave shielding thin film. In addition, there is a need for a method for increasing mass-production by preventing distortion which may be caused in an assembly process of installing the electromagnetic wave shielding thin film in the flexible electronic device, and guaranteeing high strength to endure external impact.

The electromagnetic wave shielding thin film according to an exemplary embodiment is manufactured to be formed of metal plate having elastic limit greater than or equal to 1% and strength greater than or equal to 1000 MPa. In this case, flexibility, stiffness, and scratch resistance can be satisfied to some extent as shown in table 1 presented below. For example, the material of the electromagnetic wave shielding thin film may be $Zr_{65}Al_{11}Cu_{24}$, $Zr_{62}Cu_{23}Fe_5Al_{11}$, and $Fe_{76}B_{18}Si_6$. Since the polymers shown in FIG. 1 have high elastic limit, but have low strength, the polymers are not appropriate as materials for the electromagnetic wave shielding thin film for electronic devices.

Hereinafter, materials forming the electromagnetic wave shielding thin film according to an exemplary embodiment will be explained in detail with reference to table 1. Table 1 shows the results of comparing the materials forming the electromagnetic wave shielding thin film according to an exemplary embodiment and normal material in view of flexibility, stiffness, and scratch resistance:

TABLE 1

| Materials | Flexibility | Stiffness | Scratch Resistance |
|---|---|---|---|
| $Zr_{65}Al_{11}Cu_{24}$ | ○ | ○ | ○ |
| $Zr_{64}Cu_{23}Fe_5Al_{10}$ | ○ | ○ | ○ |
| $Fe_{70}B_{18}Si_6$ | ○ | ○ | ○ |
| SUS 304 | X | Δ | Δ |
| 7075 Ae alloy | X | X | X |
| Phosphor Bronze | Δ | X | X |

(○:good, Δ: having a problem, and X: poor)

In table 1, the flexibility was determined according to the presence/absence of a crack in the electromagnetic wave shielding thin film caused by bending of an electronic device including the electromagnetic wave shielding thin film, for example. Specifically, in the case of material which did not cause a crack in the electromagnetic wave shielding thin film formed in the electronic device when the electronic device was bent 100,000 times with a radius of curvature of 2R, the flexibility was determined as being good (○). In the case of material which caused a crack in the electromagnetic wave shielding thin film formed in the electronic device when the electronic device was bent 100,000 times with the radius of curvature of 2R, but did not cause a crack in the electromagnetic wave shielding thin film formed in the electronic device when the electronic device was bent 100,000 times with a radius of curvature of 5R, the flexibility was determined as having a problem (Δ). In the case of material which caused a crack in the electromagnetic wave shielding thin film formed in the electronic device when the electronic device was bent 100,000 times with a radius of curvature of 5R, the flexibility was determined as being poor (X).

In table 1, the stiffness was determined based on compression strength of the electromagnetic wave shielding thin film according to the compression experiments conducted by American Society for Testing Materials (ASTM). Specifically, in the case of an electromagnetic wave shielding thin film which has compression strength greater than or equal to 1,000 MPa, the stiffness was determined as being good (○). In the case of an electromagnetic wave shielding thin film which has compression strength greater than or equal to 500 MPa and less than 1,000 MPa, the stiffness was determined as having a problem (Δ). In the case of an electromagnetic wave shielding thin film which has compression strength less than 500 MPa, the stiffness was determined as being poor (X).

In addition, in table 1, the scratch resistance was determined based on pencil hardness of the electromagnetic wave shielding thin film. The hardness indicates how hard or soft material is, and may be defined by a resistance of material to plastic deformation. Therefore, the hardness is normally measured based on a resistance which appears when a sample is pressed or scratched with material harder than the sample. The hardness is industrial quantity defined by test methods and is not material's own physical quantity. A method for measuring hardness is divided into an indentation hardness test, a rebound hardness test, and a scratch hardness test. The pencil hardness is scratch hardness and refers to a value which is measured by comparing hardness of material with hardness of a pencil. The pencil is divided into 9H, 8H, 7H, 6H, 5H, 4H, 3H, 2H, and H according to hardness. As the number written before H increases, the hardness increases.

Specifically, in the case of an electromagnetic wave shielding thin film which has pencil hardness greater than or equal to 9H, the scratch resistance was determined as being good (○). In the case of an electromagnetic wave shielding thin film which has pencil hardness greater than or equal to 5H and less than 9H, the scratch resistance was determined as having a problem (Δ). In the case of an electromagnetic wave shielding thin film which has pencil hardness less than 5H, the scratch resistance was determined as being poor (X).

As shown in table 1, materials forming the electromagnetic wave shielding thin film, that is, all of $Zr_{65}Al_{11}Cu_{24}$, $Zr_{62}Cu_{23}Fe_5Al_{11}$ and $Fe_{76}B_{18}Si_6$ have good flexibility, stiffness, and scratch resistance. The electromagnetic wave shielding thin film formed of the above-described materials may have a volume fraction of an amorphous phase of 50% or more, and furthermore, 90% or more or 100%. As the volume fraction of the amorphous phase increases, the elastic limit and the strength of the above-described materials increase.

Figure 2:
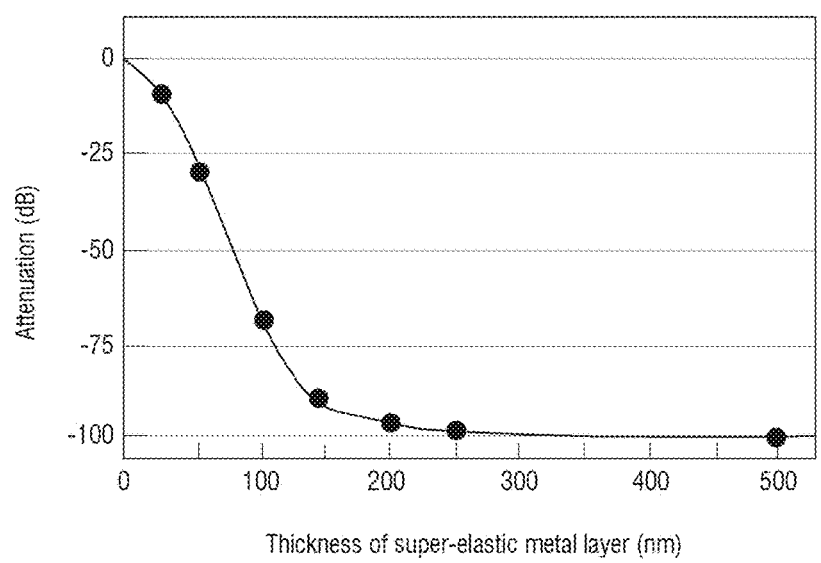
FIG. 2 is a graph showing a relationship between thickness of an electromagnetic wave shielding thin film according to an exemplary embodiment, and an attenuation rate of electromagnetic waves.

Hereinafter, the electromagnetic wave shielding performance of the electromagnetic wave shielding thin film according to an exemplary embodiment will be explained in detail. FIG. 2 is a graph showing a relationship between thickness of the electromagnetic wave shielding thin film and an attenuation rate of electromagnetic wave according to an exemplary embodiment.

Referring to FIG. 2, as the thickness of the electromagnetic wave shielding thin film increases, the electromagnetic wave shielding performance is improved. In the section in which the thickness of the electromagnetic wave shielding thin film exceeds 0 nm and is about 140 nm or less, the attenuation rate of the electromagnetic wave abruptly increases. In the section in which the thickness of the electromagnetic wave shielding thin film exceeds 140 nm, the increase rate of the attenuation rate is reduced.

Hereinafter, the attenuation rate according to the thickness of the electromagnetic wave shielding thin film will be explained in detail with reference to table 2 presented below. Table 2 shows a change in the attenuation rate of the electromagnetic wave according to a change in the thickness of the electromagnetic wave shielding thin film.

TABLE 2

| Classification | Thickness (nm) | Attenuation (dB) |
| --- | --- | --- |
| Point 1 | 30 | −10.4 |
| Point 2 | 50 | −30.5 |
| Point 3 | 100 | −69.1 |
| Point 4 | 140 | −85.0 |
| Point 5 | 200 | −88.5 |
| Point 6 | 250 | −92.7 |
| Point 7 | 500 | −99.4 |

Referring to table 2, if the thickness of the electromagnetic wave shielding thin film is 30 nm, the attenuation rate of the electromagnetic wave is −10.4 dB (point 1). If the thickness is 50 nm, the attenuation rate of the electromagnetic wave is −30.5 dB (point 2). If the thickness is 100 nm, the attenuation rate of the electromagnetic wave is −69.1 dB (point 3). If the thickness is 140 nm, the attenuation rate of the electromagnetic wave is −85.0 dB (point 4).

Therefore, it can be seen that in the section in which the thickness of the electromagnetic wave shielding thin film is 0 nm or more and is less than 140 nm, the attenuation rate of the electromagnetic wave abruptly increases. In addition, in the section in which the thickness of the electromagnetic wave shielding thin film is 200 nm, 250 nm, and 500 nm, the attenuation rates of the electromagnetic wave are −88.5 dB (point 5), −92.7 dB (point 6), and −99.4 dB (point 7), respectively. That is, it can be seen that, if the thickness of the electromagnetic wave shielding thin film exceeds 140 nm, the increate rate of the attenuation rate of the electromagnetic wave is reduced. When the electromagnetic wave shielding thin film contains an insulation layer in addition to a metal layer, the above thicknesses are applicable to the metal layer.

It is common that, if the attenuation rate of the electromagnetic wave is −10 dB or more, the electromagnetic wave can pass through the electromagnetic wave shielding thin film. Accordingly, referring to table 2, the electromagnetic wave shielding thin film shows the feature of blocking the electromagnetic wave if the thickness is 30 nm.

The electromagnetic wave shielding thin film may be considered as having a good electromagnetic wave shielding feature if the attenuation rate of the electromagnetic wave is about −30 dB, and may be considered as having an excellent electromagnetic wave shielding feature if the attenuation rate of the electromagnetic wave is about −70 dB. Accordingly, referring to table 2, the electromagnetic wave shielding thin film may be considered as having a good electromagnetic wave shielding feature if the thickness of the electromagnetic wave shielding thin film is 50 nm, and may be considered as having an excellent electromagnetic wave shielding feature if the thickness is 100 nm.

Hereinafter, a method for forming an electromagnetic wave shielding thin film according to an exemplary embodiment will be explained with reference to FIGS. 3 and 4.

Figure 3:
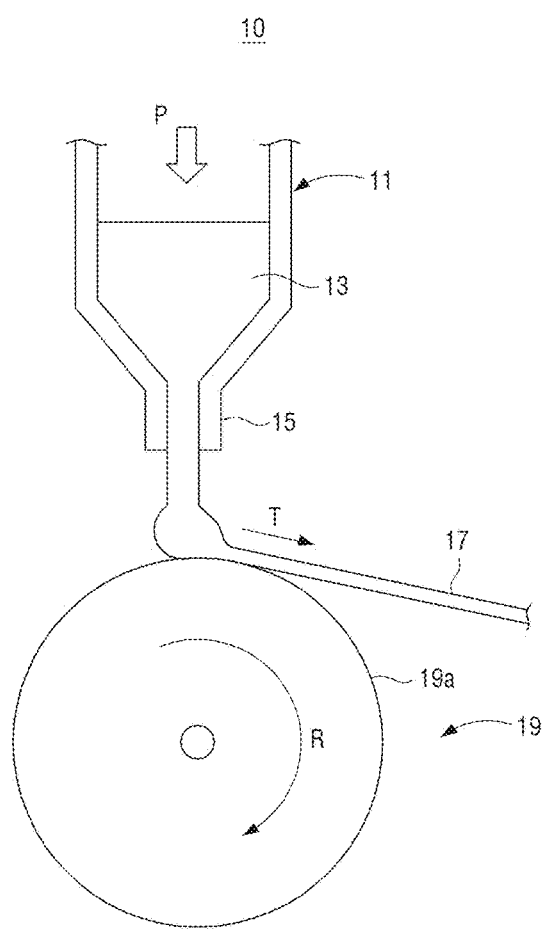
FIG. 3 is a schematic view showing a melt spinning device for performing a part of an electromagnetic wave shielding thin film forming process according to an exemplary embodiment.
Figure 4:
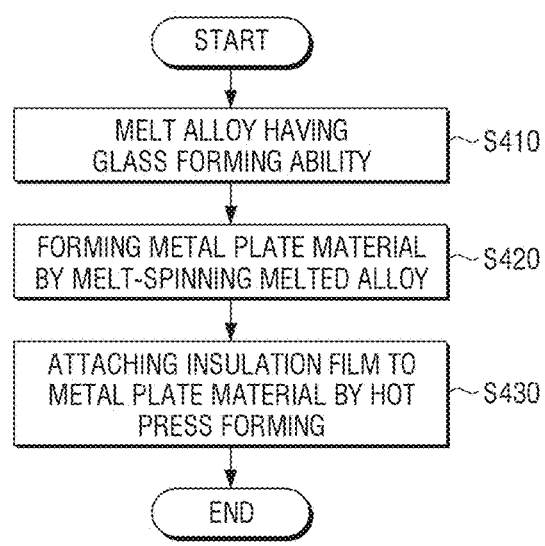
FIG. 4 is a flowchart showing a sequence of a process of forming an electromagnetic wave shielding thin film by hot press forming using metal plate which is formed by the melt spinning device of FIG. 3.

FIG. 3 is a schematic view showing a melt spinning device 10 for performing a part of a process of forming the electromagnetic wave shielding thin film according to an exemplary embodiment, and FIG. 4 is a flowchart showing a sequence of a process of forming the electromagnetic wave shielding thin film by hot press forming using metal plate formed by the melt spinning device 10 of FIG. 3.

Referring to FIG. 3, the melt spinning device 10 may include a furnace 11 and a high-speed rotation disk 19 which is disposed under the furnace 11. The furnace 11 may have a nozzle 15 formed at the lower side thereof to spray a melted alloy 13 onto an outer circumference 19a of the disk 19 which is rotated at high speed in the arrow direction R. The furnace 11 may spray the melted alloy 13 onto the outer circumference 19a of the disk 19 rotating at high speed by pressing the melted alloy 13 in the arrow direction P through the nozzle 15. The sprayed alloy 13 is separated from the outer circumference 19a of the disk 19 in the direction of tangent T of the disk 19 due to the rotational force of the disk 19, thereby being made into metal plate 17. Hereinafter, the hot press forming process will be explained in detail with reference to FIG. 4.

Referring to FIG. 4, an alloy having glass forming ability is melted (S410). The alloy having the glass forming ability may consist of at least one compound selected from $Zr_{65}Al_{11}Cu_{24}$, $Zr_{62}Cu_{23}Fe_5Al_{11}$ and $Fe_{76}B_{18}Si_6$, for example. However, this should not be considered as limiting, and the alloy may consist of at least one compound selected from various compounds including $Zr_{65}Al_{11}Cu_{24}$, $Zr_{65}Al_{10}Ni_{10}Cu_{15}$, $Zr_{62}Cu_{23}Fe_5Al_{10}$, $Zr_{41.2}Ti_{13.8}Cu_{12.5}Ni_{10}Be_{22.5}$, $Zr_{44}Ti_{11}Cu_{10}Ni_{10}Be_{25}$, $Zr_{35}Ti_{30}Cu_{8.25}Be_{26.75}$, $Fe_{76}B_{18}Si_6$, $Fe_{61}Mn_{10}Cr_4Mo_{14}Er_1C_{15}B_6$, $Fe_{63}Cr_4Nb_7B_{26}$, $Al_{85}Ni_5Co_2Y_8$, $Ce_{60}Al_{20}Ni_{10}Cu_{10}$, $Cu_{60}Zr_{20}Hf_{20}Ti_{10}$, $Pt_{57.5}Cu_{14.7}Ni_{5.3}P_{22.5}$, $Mg_{65}Cu_{25}Y_{10}$, $Au_{49}Ag_{5.5}Pd_{2.3}Cu_{26.9}Si_{16.3}$, $Pd_{43}Ni_{10}Cu_{27}P_{20}$ and $Ti_{40}Zr_{26}Be_{28}Fe_6$. The alloy having the glass forming ability is melted in the furnace using an arc melting method, etc., for example.

Thereafter, metal plate may be formed by melt-spinning the melted alloy (S420). Specifically, the alloy melted in the furnace is sprayed onto the surface of the disk rotating at predetermined rotation speed using pressure of inert gas. The predetermined rotation speed may be about 700 to 900 rpm, and an angle formed between the disk and the spraying direction when the melted alloy is sprayed is about 60-80 degrees, but is not limited to this. As described above, the sprayed alloy is separated from the outer circumference of the disk in the direction of tangent of the disk by the rotational force of the disk, thereby being made into metal plate. In this case, since the disk rotating at high speed is cooled at low temperature, the alloy sprayed onto the outer circumference of the disk may be cooled at a maximized cooling rate of about $10^4$-$10^6$ K/sec or higher. Accordingly, a compositional range for forming amorphous material can be extended. In addition, the thickness of the metal plate can be adjusted as desired by adjusting the rotation speed of the disk.

An insulation film may be attached to the metal plate by hot press forming (S430). Specifically, the insulation film and the metal plate are mounted in a hot press forming device to face each other. Thereafter, high temperature heat is applied to the insulation film and the metal plate in a pressed state so as to adhere the insulation film and the metal plate to each other. Through this process, the metal plate and the insulation film are adhered to each other, thereby being made into the electromagnetic wave shielding thin film to be installed in an electronic device.

In this case, the insulation film may be a polyimide film (PI film). The PI film is a film which can withstand high temperature of 400 degrees or higher above zero or low temperature of 269 degrees below zero, and is high-tech and high-performance industrial material which is thin and has excellent flexibility. The PI film has high chemical resistance and high abrasion resistance, and thus is widely used in the field which is required to maintain stable performance in a poor environment. In its infancy, the PI film was developed and used as material for the aerospace industry field, but currently, is widely used in various fields such as industrial devices, flexible printed circuit boards (FPCBs), electric electronic parts, etc. As the functions of IT devices have become diversified and the devices have become slimmer in recent years, there is an increasing demand for a PI film for a heat-dissipating sheet to solve the heat problem.

Hereinafter, a method for forming an electromagnetic wave shielding thin film according to another exemplary embodiment will be explained in detail with reference to FIGS. 5 and 6.

Figure 5:
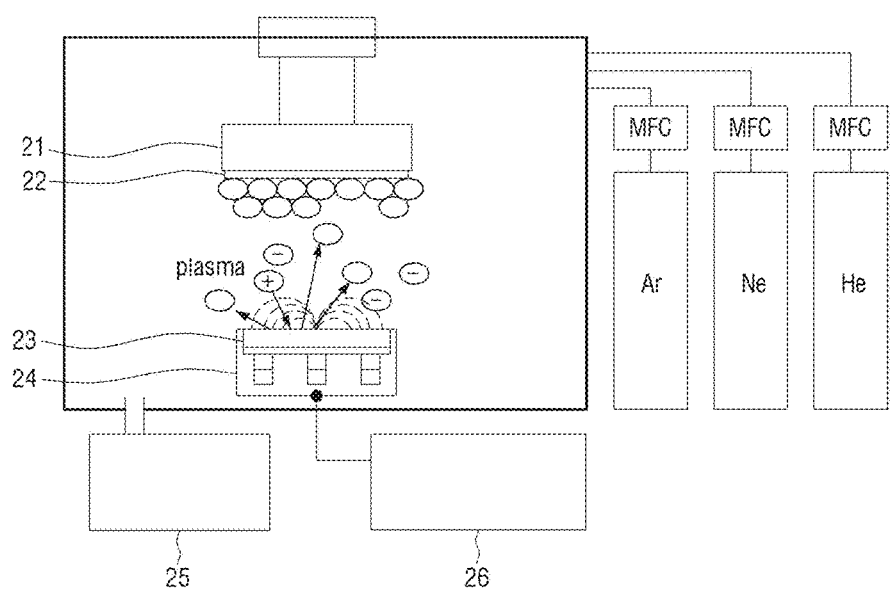
FIG. 5 is a schematic view showing a sputtering device for performing an electromagnetic wave shielding thin film forming process according to an exemplary embodiment.
Figure 6:
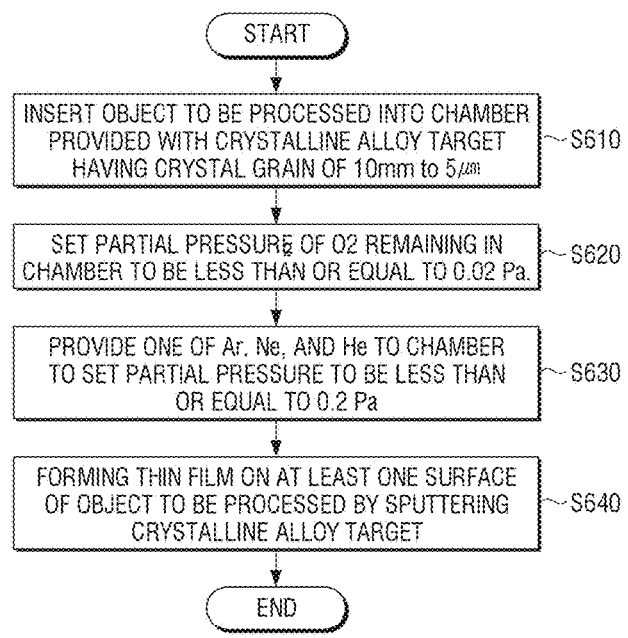
FIG. 6 is a flowchart showing a sequence of a process of forming an electromagnetic wave shielding thin film using the sputtering device of FIG. 5.

FIG. 5 is a schematic view showing a sputtering device for performing an electromagnetic wave shielding thin film forming process according to an exemplary embodiment, and FIG. 6 is a flowchart showing a sequence of a process of forming an electromagnetic wave shielding thin film using the sputtering device of FIG. 5.

Referring to FIG. 5, the sputtering device makes a target 23, to which a negative voltage is applied by a sputtering gun 24 which is supplied with power by a power supply device 26, collide with Ar, He, Ne, etc. at high speed in a chamber in which a vacuum pump 25 is operated, and provide atoms separated from the crystalline alloy target 23 to an object 22 to be processed on a holder 21. Accordingly, a thin film may be formed on the surface of the object 22 to be processed. Hereinafter, a sputtering process will be explained in detail with reference to FIG. 6.

Referring to FIG. 6, the object to be processed is inserted into the chamber provided with the crystalline alloy target having crystal grains of size of 10 nm-5 μm (S610). The crystalline alloy used as the target is an alloy having glass forming ability, and may consist of at least one compound selected from $Zr_{65}Al_{11}Cu_{24}$, $Zr_{62}Cu_{23}Fe_5Al_{11}$ and $Fe_{76}B_{18}Si_6$. However, this should not be considered as limiting, and the crystalline alloy may consist of at least one compound selected from various compounds including $Zr_{65}Al_1Cu_{24}$, $Zr_{65}Al_{10}Ni_{10}Cu_{15}$, $Zr_{62}Cu_{23}Fe_5Al_{10}$, $Zr_{41.2}Ti1_{3.8}Cu1_{2.5}Ni_{10}Be_{22.5}$, $Zr_{44}Ti_{11}Cu_{10}Ni_{10}Be_{25}$, $Zr_{35}Ti_{30}Cu_{8.25}Be_{26.75}$, $Fe_{76}B_{18}Si_6$, $Fe_{61}Mn_{10}Cr_4Mo_{14}Er_1C_{15}B_6$, $Fe_{63}Cr_4Nb_7B_{26}$, $Al_{85}Ni_5Co_2Y_8$, $Ce_{60}Al_{20}Ni_{10}Cu_{10}$, $Cu_{60}Zr_{20}Hf_{20}Ti_{10}$, $Pt_{57.5}Cu_{14.7}Ni_{5.3}P_{22.5}$, $Mg_{65}Cu_{25}Y_{10}$, $Au_{49}Ag_{5.5}Pd_{2.3}Cu_{26.9}Si_{16.3}$, $Pd_{43}Ni_{10}Cu_{27}P_{20}$ and $Ti_{40}Zr_{26}Be_{28}Fe_6$.

The size of the crystal grain of the crystalline alloy used as the target may be 5 μm or less. When the size of the crystal grain of the target is larger than 5 μm, the composition of the thin film deposited onto the object to be processed may not be uniform. If the composition of the thin film is not uniform, the elastic limit and the strength may be greatly reduced, and thus the size of the crystal grain needs to be adjusted.

The size of the crystal grain of the crystalline alloy used as the target may be 10 nm or more. When the size of the crystal grain of the target is less than 10 nm, the crystal grain grows due to local heating of the target while the sputtering process proceeds, and thus the target may be fractured.

In response to the target being inserted into the chamber, the partial pressure of $O_2$ remaining in the chamber is set to be 0.02 Pa or less (S620). In other words, this process is a process which makes the inner space of the chamber in an almost vacuum state. In the inner space of the chamber in the vacuum state, in response to the partial pressure of $O_2$ which is a component of the remaining air being larger than 0.02 Pa, the sputtering particles react with $O_2$, and thus are crystallized and deposited onto the object to be processed. On the other hand, the partial pressure of $N_2$, which is another component of the remaining air, does not need to be adjusted. The thin film deposited by reacting with $O_2$ does not have required elastic limit. Accordingly, when the thin film deposited by reacting with $O_2$ is formed in a flexible electronic device, the thin film may suffer from plastic deformation or may be easily fractured due to the repeated deformation of the electronic device.

In response to the partial pressure of $O_2$ being adjusted, one of Ar, Ne, and He is provided to the chamber to have partial pressure less than or equal to 0.2 Pa (S630). Gas containers including Ar, Ne, and He respectively are connected to the chamber. The gas containers have Mass Flow Controllers (MFCs) installed therein to adjust the partial pressure of the gas provided to the chamber. In this case, the MFC may calculate a flow with reference to the mass of gas. Since the elements forming the gas have different mass, the MFCs set according to respective gases may be separately installed in every container. When the MFC is not separately installed in every container as described above, the mass may be corrected and used.

Thereafter, the thin film is formed on at least one surface of the object to be processed by sputtering the crystalline alloy target (S640). In this case, the object to be processed may be polyimide. A thinner thin film may be formed on the polyimide which is the object to be processed using the sputtering process.

Figure 7:
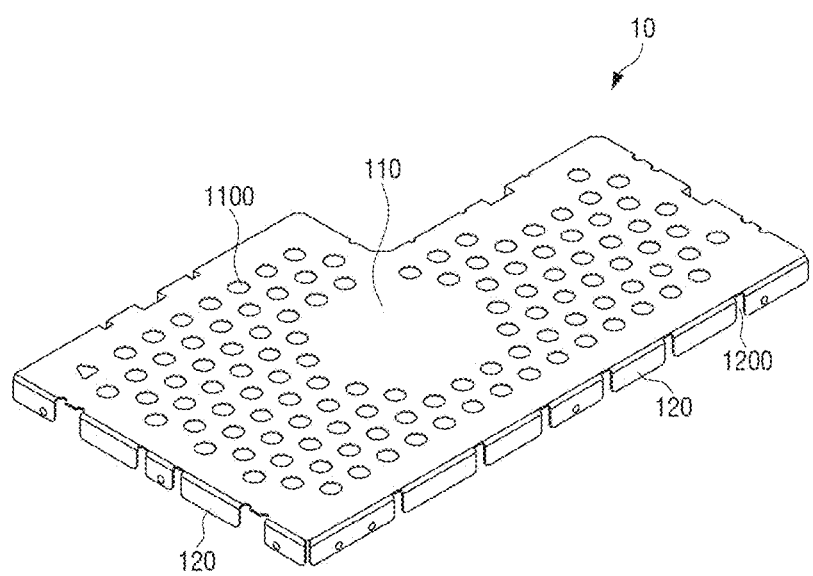
FIG. 7 is a perspective view showing an electromagnetic wave shielding structure according to an exemplary embodiment.
Figure 8:
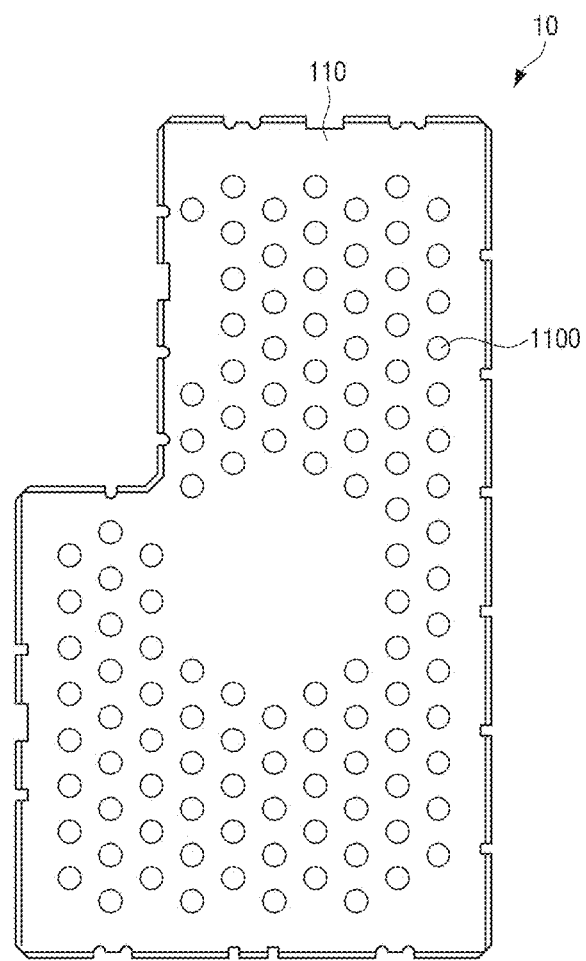
FIG. 8 is a plane view showing an outer surface of the electromagnetic wave shielding structure according to an exemplary embodiment.
Figure 9:
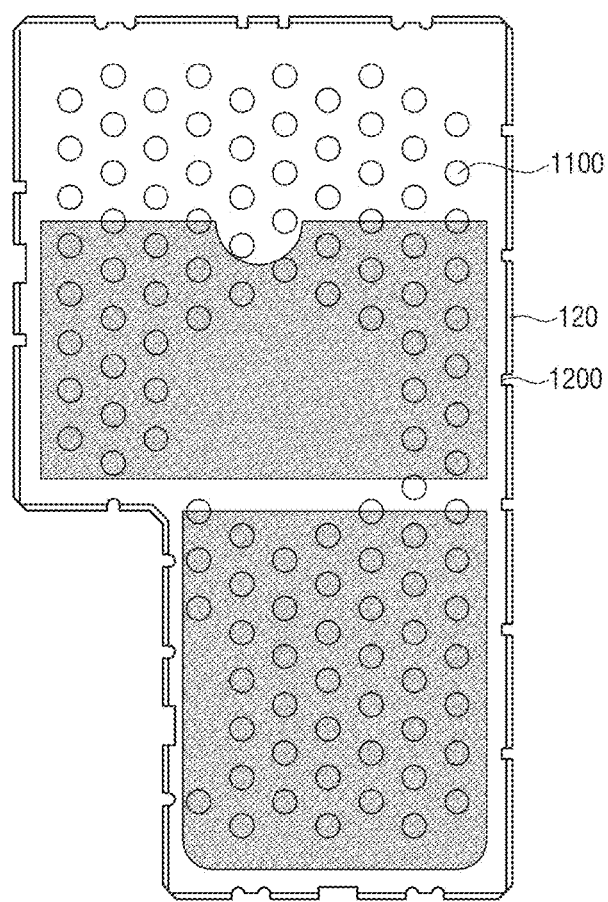
FIG. 9 is a plane view showing an inner surface of the electromagnetic wave shielding structure according to an exemplary embodiment.

FIG. 7 is a perspective view showing an electromagnetic wave shielding structure according to an exemplary embodiment, FIG. 8 is a plane view showing an outer surface of the electromagnetic wave shielding structure according to an exemplary embodiment, and FIG. 9 is a plane view showing an inner surface of the electromagnetic wave shielding structure according to an exemplary embodiment.

As shown in FIGS. 7 to 9, a shielding thin film formed in the form of a ribbon may be formed in a predetermined shape to enclose electronic parts, thereby providing an electromagnetic wave shielding structure 10. For example, the shielding structure 10 may be a shield can and may be formed by hot press forming in a super cooled liquid region of the shielding thin film, thereby having superelasticity. In addition, since much plastic deformation may occur in the super cooled liquid region, the shielding thin film may be formed as a precise shielding structure 10 having a predetermined shape.

The shielding structure 10 may be connected with a printed circuit board (PCB) to shield electronic function groups (not shown) mounted in the PCB from electromagnetic waves. For example, the shielding structure 10 may be fixed to the PCB in contact with the top surface of the PCB. The shielding structure 10 may include an upper part 110 for covering the electronic function groups, and a side part 120 downwardly extending from the edge of the upper part 110.

The upper part 110 may be provided with a plurality of punctures 1100. The side part 120 may have a slot 1200. The slot 1200 may be formed by cutting from the end of the side part 120 to the edge of the upper part 110 in the vertical direction. The shape and size of the shielding structure 10 may vary to correspond to the electronic function groups.

Since the shielding structure shows excellent elastic limit and strength, the shielding structure may be formed in a flexible electronic device to block electromagnetic waves. In addition, the polyimide is used as an insulation layer and thus a heat-dissipating effect can also be expected.

In addition, distortion is prevented in the assembly process of forming the shielding structure in the electronic device, and thus mass production can be improved. In addition, since the shielding structure is resistant to external impact, the reliability of a product can be improved. Therefore, the shielding structure does not only substitute for the existing electromagnetic wave shielding structure but it also will be applied to the flexible electronic device in the future and will lead the market.

The foregoing exemplary embodiments and advantages are merely exemplary and are not to be construed as limiting the present disclosure. The present teaching can be readily applied to other types of apparatus. Also, the description of the exemplary embodiments of the present disclosure is intended to be illustrative, and not to limit the scope of the claims, and many alternatives, modifications, and variations will be apparent to those skilled in the art.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An electromagnetic wave shielding thin film to shield against electromagnetic waves generated by an electronic part, the electromagnetic wave shielding thin film comprising:

a metal plate having an elastic limit of 1% or more, a compression strength of 1000 MPa or more, and an amorphous phase present in the metal plate at a volume fraction of 50% or more, wherein the metal plate has been formed by melt-spinning a melted alloy having glass forming ability, and wherein the alloy having the glass forming ability comprises at least one compound selected from $Zr_{65}Al_{11}Cu_{24}$, $Zr_{62}Cu_{23}Fe_5Al_{11}$, and $Fe_{76}B_{18}Si_6$.

2. The electromagnetic wave shielding thin film of claim 1, wherein the metal plate has a thickness in a range of 30 nm-140 nm.

3. The electromagnetic wave shielding thin film of claim 1, further comprising an insulation film disposed on a surface of the metal plate.

4. The electromagnetic wave shielding thin film of claim 3, wherein the insulation film is a polyimide film.

5. The electromagnetic wave shielding thin film of claim 3, wherein the insulation film is attached to the metal plate by hot press forming.

6. The electromagnetic wave shielding thin film of claim 3, wherein the metal plate has been formed on the insulation film by sputtering a crystalline alloy target.

7. The electromagnetic wave shielding thin film of claim 6, wherein the crystalline alloy target has a crystal grain size in a range of 10 nm-5 μm.

8. An electronic device comprising:
an electronic part; and
the electromagnetic wave shielding thin film of claim 1, arranged to shield the electronic part from electromagnetic waves.

9. An electromagnetic wave shielding structure for shielding from electromagnetic waves generated by an electronic part, comprising:

a metal plate formed into a predetermined shape to enclose the electronic part, the metal plate having an elastic limit of 1% or more, a compression strength of 1000 MPa or more, and an amorphous phase present in the metal plate at a volume fraction of 50% or more, wherein the metal plate has been formed by melt-spinning a melted alloy having glass forming ability, and wherein the alloy having the glass forming ability comprises at least one compound selected from $Zr_{65}Al_{11}Cu_{24}$, $Zr_{62}Cu_{23}Al_{11}$, and $Fe_{76}B_{18}Si_6$.

10. The electromagnetic wave shielding structure of claim 9, further comprising an insulation film disposed on a surface of the shaped metal plate.

11. The electromagnetic wave shielding structure of claim 9, wherein the shaped metal plate includes:
a planar central portion; and
side parts located along an edge of the planar central portion and oriented substantially perpendicular to the planar central portion so as to form lateral faces of the shaped metal plate.

12. A method for forming a shielding thin film for shielding against electromagnetic waves generated by an electronic part, the method comprising:

forming a metal plate of the shielding thin film such that the metal plate has an elastic limit of 1% or more, compression strength of 1000 MPa or more, and an amorphous phase contained in the metal plate at a volume fraction of 50% or more;

and melting an alloy having glass forming ability, wherein the forming the metal plate includes melt-spinning the melted alloy to form the metal plate by solidifying the melted alloy as the metal material of the metal plate, and wherein the alloy having the glass forming ability comprises at least one compound selected from $Zr_{65}Al_{11}Cu_{24}$, $Zr_{62}Cu_{23}Fe_5Al_{11}$, and $Fe_{76}B_{18}Si_6$.

13. The method of claim 12, further comprising attaching an insulation film to the metal plate through separate hot pressing forming after forming the metal plate.

14. The method of claim 12, wherein the insulation film is polyimide.

15. The method of claim 12, wherein the forming the metal plate includes sputtering a crystalline alloy target having a crystal grain size in a range of 10 nm-5 μm, such that atoms sputtered from the crystalline alloy target are deposited to thereby form the metal plate.

* * * * *